(12) United States Patent
Carey et al.

(10) Patent No.: US 6,686,068 B2
(45) Date of Patent: Feb. 3, 2004

(54) HETEROGENEOUS SPACERS FOR CPP GMR STACKS

(75) Inventors: Matthew Joseph Carey, San Jose, CA (US); Jeffrey Robinson Childress, San Jose, CA (US); Bruce Alvin Gurney, San Rafael, CA (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 09/791,510

(22) Filed: Feb. 21, 2001

(65) Prior Publication Data

US 2002/0114974 A1 Aug. 22, 2002

(51) Int. Cl.[7] .................................................. G11B 5/66
(52) U.S. Cl. ............ 428/692; 428/694 R; 428/694 TM; 428/694 TS; 428/900; 360/113; 360/319; 360/324; 360/324.1
(58) Field of Search ......................... 428/694, 694 TM, 428/694 TS, 692, 900; 360/113, 319, 324.1, 324

(56) References Cited

U.S. PATENT DOCUMENTS 5,576,914 A * 11/1996 Rottmayer .................. 360/113
6,456,465 B1 * 9/2002 Louis
6,466,419 B1 * 10/2002 Mao
6,473,275 B1 * 10/2002 Gill
6,473,279 B2 * 10/2002 Smith
6,560,077 B2 * 5/2003 Fujiwara

OTHER PUBLICATIONS

Abeles et al. Percolation Conductivity in $W-AL_2O_3$ Granular Metal Films: Physical Review Letters vol. 35, No. 4, Jul. 28, 1975.*

B. Abeles, H. L. Pinch, and J. I. Gittleman: Percolation conductivity in $W-AL_2 O_3$ granular metal films; Physical Review Letters, vol. 35, No. 4, Jul. 28, 1975.

* cited by examiner

Primary Examiner—Leszek Kiliman
(74) Attorney, Agent, or Firm—Lumen Intellectual Property Services, Inc.

(57) ABSTRACT

A CPP magnetoresistive sensor with a spacer layer made of a heterogeneous material, which is composed of conductive grains within a highly resistive matrix, has a high resistance. The conductive grains are typically made of a conductive element or alloy that can operate as a GMR spacer material. The highly resistive matrix is typically made of a highly resistive or insulating element, alloy or compound that will hinder the flow of electrons. The sensing electrical current is passed through the conductive grains, which are typically made of the same material as GMR spacers, so the GMR is maintained even though the overall resistance is increased.

15 Claims, 8 Drawing Sheets

HETEROGENEOUS SPACERS FOR CPP GMR STACKS

FIELD OF THE INVENTION

This invention relates generally to giant magnetoresistive (GMR) sensors. More particularly, it relates to current-perpendicular-to-plane (CPP) magnetoresistive sensors.

BACKGROUND ART

Conventional magnetoresistive (MR) sensors, such as those used in magnetic recording disk drives, operate on the basis of the anisotropic magnetoresistive (AMR) effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change in resistance in the read element and a corresponding change in the sensing electrical current or voltage.

A different and more pronounced magnetoresistance, called giant magnetoresistance (GMR), has been observed in a variety of magnetic multilayered structures, the essential feature being at least two ferromagnetic metal layers separated by a nonferromagnetic metal layer. The physical origin of the GMR effect is that the application of an external magnetic field causes a variation in the relative orientation of magnetization of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure, called a spin valve, including two uncoupled or weakly coupled ferromagnetic layers separated by a non-magnetic metal layer in which the magnetization of one of the ferromagnetic layers is pinned. The pinning may be achieved by depositing the layer onto an antiferromagnetic layer which exchange-couples to the pinned layer. The unpinned layer or free ferromagnetic layer is free to rotate in the presence of small external magnetic field.

In GMR read heads, spin valves are typically arranged to operate in a CIP (current-in-plane) mode. In order to increase the recording density of a system, the track width of a read sensor must be made smaller. This reduces the signal available from a CIP sensor. However, in the CPP (current-perpendicular-to-plane) mode, the signal increases as the sensor width is reduced.

Figure 1:
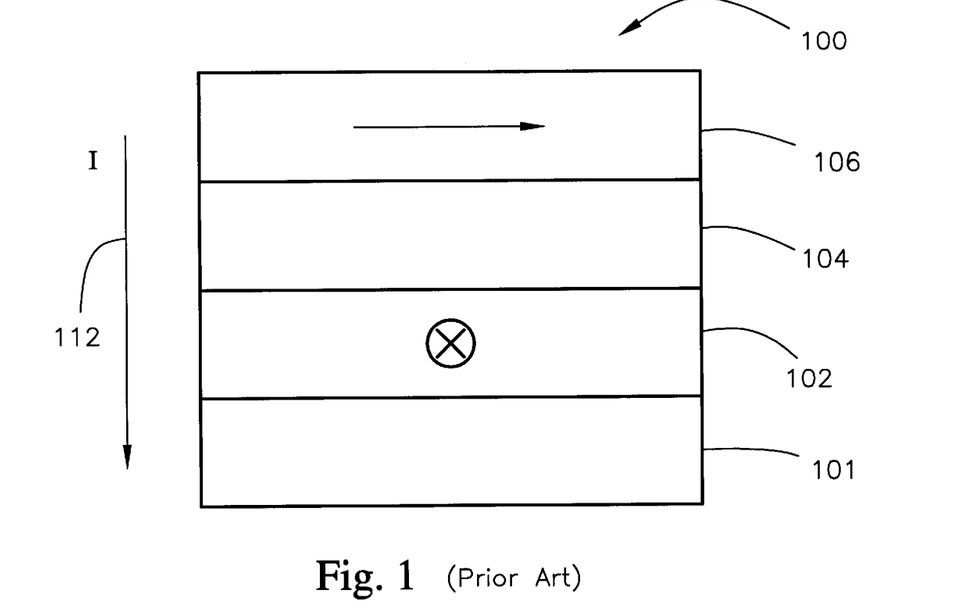
FIG. 1 depicts a cross-sectional schematic diagram of a simple CPP spin valve of the prior art.

CPP spin valves have been oriented so that the bias current that is applied to the GMR films is perpendicular to the plane of the films. FIG. 1 shows a cross-sectional schematic diagram of a CPP spin valve 100 of the prior art. As shown in FIG. 1, CPP spin valve 100 includes a ferromagnetic free layer 106, a ferromagnetic pinned layer 102, a spacer layer 104 disposed between the ferromagnetic free layer 106 and the ferromagnetic pinned layer 102, and an anti-ferromagnetic layer 101 proximate the ferromagnetic pinned layer 102. A sensing electrical current 112 is perpendicular to the plane of the CPP spin valve 100's layers (e.g., current flows vertically within the stack). The directions for the magnetizations of the ferromagnetic free layer 106 and the ferromagnetic pinned layer 102 are indicated.

The spacer layer 104 is typically made of a conductive material such as a metal or metallic alloy.

One major problem of CPP spin valves is their low resistance. The resistance of a CPP spin valve is calculated by the following formula:

$$R = \rho(L/A) \tag{1}$$

Where $\rho$ is the resistivity of the CPP spin valve;

L is the length of the CPP spin valve; and

A is the cross-sectional area of the CPP spin valve.

For example, a 100 Gbit/in$^2$-CPP spin valve having a resistivity of about 10 $\mu\Omega$-cm (e.g., metallic structure), a length L of about 500 Å, and a square cross section of about 500 Å on a side will have a resistance R of about 2 $\Omega$. If 1 mA (i.e., $4 \times 10^{-7}$ amp/cm$^2$) flows through this CPP spin valve which will typically exhibit a magnetoresistance ($\Delta R/R$) value of about 25%, then a voltage signal $\Delta V$ obtained is about 0.5 mV peak-to-peak. Such a small resistivity given the low value of R thus translates into a small $\Delta V$ which is difficult to detect.

Based on the formula (1), to increase the resistance of the CPP spin valve for achieving high voltage signal levels, one could either reduce the cross-sectional area A of the sensor, or increase the length L of the stack, or increases the resistivity $\rho$. One could manipulate the dimensions of the sensor, increasing L and decreasing A, to increase the sensor resistance. However, these dimensions are usually dictated by the recording density and cannot be altered much. Another approach involves increasing the resistivity of the CPP spin valve. However this usually involves introducing electron scattering sites to the sensor material, which tend to cause spin-flip scattering as well, and reduce $\Delta R/R$.

There is a need, therefore, for an improved CPP magnetoresitive sensor, such as spin valve, that increases the resistance of the sensor and thus, the voltage signal $\Delta V$ peak-to-peak, without reducing $\Delta R/R$.

OBJECTS AND ADVANTAGES

Accordingly, it is a primary object of the present invention to provide a CPP magnetoresistive sensor with high resistance.

It is a further object of the present invention to provide a CPP magnetoresistive sensor with enhanced magnetoresistance ($\Delta R/R$).

It is an additional object of the present invention to provide a CPP magnetoresistive sensor generating high voltage signal levels.

It is a further object of the present invention to provide methods of making such a CPP magnetoresistive sensor.

SUMMARY

These objects and advantages are attained by CPP magnetoresistive sensors with heterogeneous spacer layers.

According to a first embodiment of the present invention, a simple CPP spin valve includes a ferromagnetic free layer, a ferromagnetic pinned layer, a spacer layer disposed between the ferromagnetic free layer and the ferromagnetic pinned layer such that a magnetization of the ferromagnetic free layer is oriented by a magnetization of the ferromagnetic pinned layer. The CPP simple spin valve further includes an AF layer for pinning a magnetization of the ferromagnetic pinned layer. A sensing electrical current flows perpendicular with the CPP spin valve's layers. The spacer layer includes a heterogeneous material, which is composed of conductive grains within a highly resistive matrix. The conductive grains are typically made of a conductive material, such as Cu, Au, Ag and their alloys, which operate as a GMR spacer material. The highly resistive matrix typically includes an insulating or highly resistive material, such as Si, $SiO_2$, $Al_2O_3$, or NiO, which hinders the flow of electrons. The sensing electrical current travels from the ferromagnetic free layer to the ferromagnetic pinned layer through the conductive grains. Since no additional electron scattering sites are present in the conductive grains in the heterogeneous material of this type the magnetoresistance ($\Delta R/R$) is maintained. The heterogeneous materials of the spacer layer have high resistivities, which increase the resistance of the spacer layer, thus of the entire CPP spin valve. As a result, higher voltage signal levels can be obtained from the CPP spin valve.

Heterogeneous spacer layers can be used in CPP dual spin valves according to an alternative embodiment of the present invention. A CPP dual spin valve includes a ferromagnetic free layer sandwiched by first and second heterogeneous spacer layers, first and second ferromagnetic pinned layers proximate the first and second heterogeneous spacer layers respectively, and first and second AF layers adjacent to the first and second ferromagnetic pinned layers respectively.

Heterogeneous spacer layers can also be used in CPP multilayer magnetoresistive sensors according to another alternative embodiment of the present invention. A CPP multilayer magnetoresistive sensor can include multiple ferromagnetic free layers and multiple heterogeneous spacer layers, wherein each spacer layer is disposed between two ferromagnetic free layers. CPP multilayer magnetoresistive sensors produce higher resistances than simple CPP spin valves since each additional heterogeneous spacer layer will have a considerable resistance contribution to the total resistance of the CPP magnetoresistive sensors.

Several methods of making heterogeneous spacer layers are described in a second embodiment of the present invention. A well-known way to produce heterogeneous spacer layers is by co-depositing of an immiscible conductive material and an insulating or highly resistive material. In this method, the spacer layer can be produced from metals, such as Cu or Au, with oxides, such as $SiO_2$ or $Al_2O_3$. The spacer layer can also be produced from co-deposited Au and Si.

Another method of making heterogeneous spacer layers involves a two steps process. A layer of a heterogeneous material of two metals, one of which resists oxidation, is first sputtered-deposited. This heterogeneous layer is then exposed to oxygen so that one metal is oxidized while the other metal remains metallic form.

An additional method of making heterogeneous spacer layers involves depositing a discontinuous insulating or highly resistive layer on top of a conductive layer. The holes in the discontinuous layer result in limited current paths for the electrons. A similar method involves depositing a discontinuous conductive layer on top of another conductive layer that resists oxidation. The structure is exposed to oxygen to oxidize the discontinuous layer and thus produce a highly resistive matrix.

A further method of making heterogeneous spacer layers involves depositing a homogeneous metal layer, such as Cu layer. This metal layer is then partially oxidized to form a heterogeneous layer including conductive grains of un-oxidized metal pinholes within a highly resistive matrix of metal oxide.

CPP magnetoresistive sensors with heterogeneous spacer layers of the types described in the first and second embodiments can be incorporated in CPP GMR read/write heads according to a third embodiment of the present invention. A CPP GMR read/write head includes a first shield contacting a first conductive gap, a second shield contacting a second conductive gap, and a CPP magnetoresistive sensor with heterogeneous spacer layer disposed between the first and the second conductive gaps.

CPP GMR read/write heads of the type as described in the third embodiment can be incorporated in disk drives according to a fourth embodiment of the present invention. A disk drive includes a magnetic recording disk, and a CPP GMR read/write head having a CPP magnetoresistive sensor with heterogeneous spacer layers. The disk drive further includes an actuator connected to the CPP GMR read/write head for moving the CPP GMR read/write head across the magnetic recording disk, and a mechanism for moving the magnetic recording disk relative to the CPP GMR read/write head.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 2:
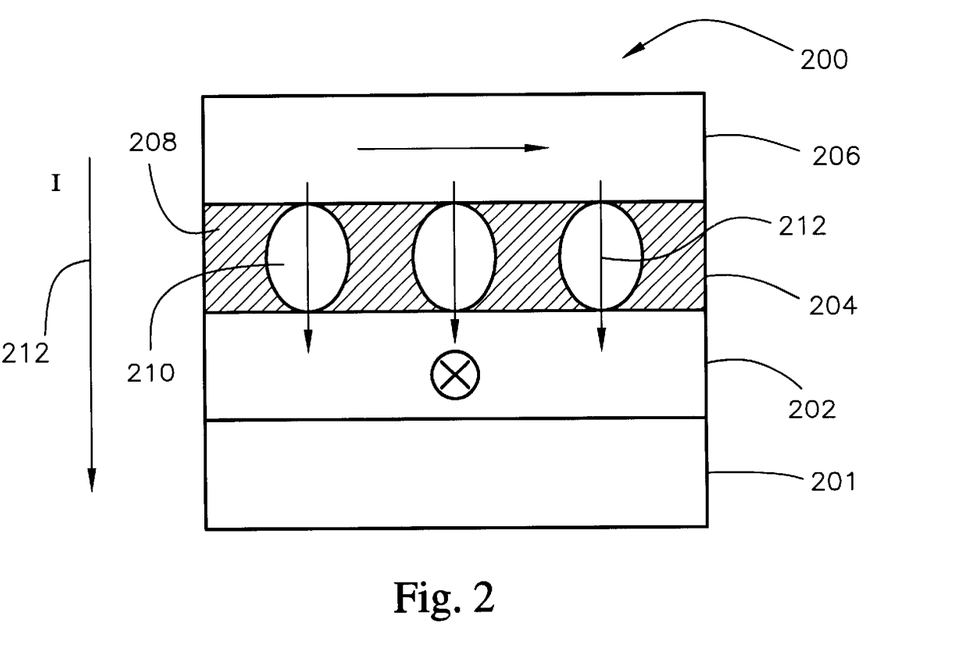
FIG. 2 depicts a cross-sectional schematic diagram of a simple CPP spin valve according to a first embodiment of the present invention.

Increasing a resistance of a current-perpendicular-to-plane (CPP) simple spin valve using a heterogeneous spacer layer is described in a first embodiment of the invention, which is illustrated in FIG. 2. As shown in FIG. 2, a simple CPP spin valve 200 includes a ferromagnetic free layer 206, a ferromagnetic pinned layer 202, and a spacer layer 204 disposed between the ferromagnetic free layer 206 and the ferromagnetic pinned layer 202 such that a magnetization of the ferromagnetic free layer 206 is oriented by a magnetization of the ferromagnetic pinned layer 202. CPP spin valve 200 further includes an anti-ferromagnetic layer 201 for pinning a magnetization of the ferromagnetic pinned layer 202. A sensing electric current 212 flows perpendicular to the CPP spin valve 200's layers.

The ferromagnetic free layer 206 is typically made of a material containing Ni, Fe, Co or alloys of Ni, Fe and Co such as NiFe, NiCo, and FeCo. The ferromagnetic pinned layer 202, typically includes Co, and the AF layer 201 is typically made of a material containing Mn, such as FeMn, PtMn, IrMn, PdPtMn and NiMn. The spacer layer 204 is made of a heterogeneous material, which is composed of conductive grains 210 within a highly resistive matrix 208. The conductive grains 210 are typically made of conductive materials, such as Cu, Au, Ag or their alloys, which may operate as a GMR spacer material. The content of the conductive grains 210 in the spacer layer 204 is typically between about 1 volume % and about 50 volume %. The highly resistive matrix 208 is typically made of an insulating or a highly resistive material, such as Si, $Al_2O_3$, $SiO_2$, or NiO, which hinders the flow of electrons. The content of the highly resistive matrix 208 in the spacer layer 204 is between about 99 volume % and about 50 volume %. The materials of conductive grains 210 and the highly resistive matrix 208 may be immiscible or have a very low miscibility. Obviously, care should be taken to make the conductive grains as free as possible from defects and impurity contamination from the resistive matrix to optimize the magnetoresistance ($\Delta R/R$). Some degradation in the $\Delta R/R$ of the conductive grains within the heterogeneous spacer layer could be accommodated before the voltage signal would be less than for a sample with a pure homogeneous spacer layer.

The sensing electric current 212 is passed through the CPP spin valve 200, from the ferromagnetic free layer 206 to the ferromagnetic pinned layer 202, only through the conductive grains 210, with minimal spin-dependent scattering of conductive electrons. Thus the magnetoresistance ($\Delta R/R$) of the CPP spin valve 200 is not reduced even though the overall resistance of the spacer is increased. The spacer layer 204 with high resistivity due to the heterogeneous material increases the overall resistance of the CPP spin valve 200. As a result, high voltage signal levels of the CPP spin valve 200 are achieved.

The effect of the heterogeneous materials of the spacer layer on the voltage signals of a simple CPP spin valve is significant. For example, if a spacer layer of about 50 Å thick of a CPP spin valve, which has a length L of about 500 Å and sides of about 500 Å, is typically made of pure copper, which has a resistivity of about 3 $\mu\Omega$-cm, this spacer layer produces a resistance of only about 0.06 $\Omega$. Thus the CPP spin valve has a total resistance of about 2 $\Omega$ with a voltage signal of about 0.5 mV. If the spacer layer of the above CPP spin valve is made of a heterogeneous material, which for example could include copper grains of about 5% of the volume of the spacer layer and a highly resistive matrix consisting of 95% of the volume of the spacer layer, the resistance of the spacer layer is 1.2 $\Omega$, which is 20 times greater than the resistance with the pure copper spacer layer. Thus, the total resistance of the CPP spin valve is about 3 $\Omega$ rather than 2 $\Omega$, and a high voltage signal of about 0.75 mV is obtained if applying the same sensing electrical current, without reducing of magnetoresistance ($\Delta R/R$). Specific values and numbers are for illustration only without limiting the scope of the invention.

Figure 3:
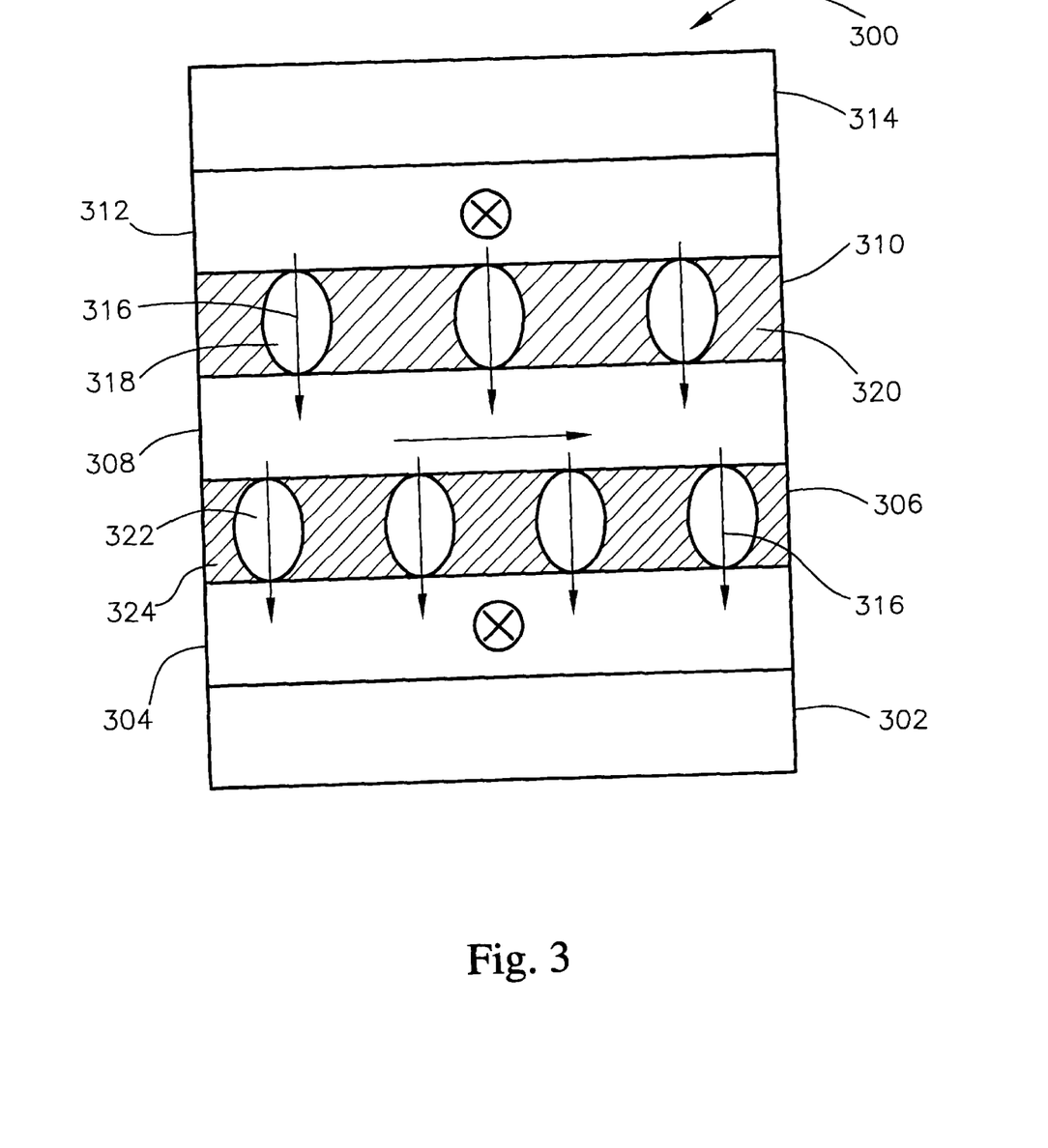
FIG. 3 depicts a cross-sectional schematic diagram of a CPP dual spin valve according to an alternative embodiment of the present invention.

Alternatively, the heterogeneous spacer layers may be used in a CPP dual spin valve, which is shown in FIG. 3. As shown in FIG. 3, CPP dual spin valve 300 includes a ferromagnetic free layer 308. First and second heterogeneous spacer layers 310 and 306 sandwich the ferromagnetic free layer 308, and first and second ferromagnetic pinned layers 312 and 304 proximate the first and second heterogeneous spacer layers 310 and 306 respectively. The CPP dual spin valve 300 further includes first and second AF layers 314 and 302 adjacent to the first and second ferromagnetic pinned layers 312 and 304 respectively. The first heterogeneous spacer layer 310 is composed of conductive grains 318 within a highly resistive matrix 320, and the second heterogeneous spacer layer 308 is composed of conductive grains 322 within a highly resistive matrix 324. A sensing electrical current 316 travels through the conductive grains 318 and 322 of the first and second heterogeneous spacer layers 310 and 308 respectively. Materials of all layers of the CPP dual spin valve 300 are similar to those of the corresponding layers in CPP simple spin valve 200 described in FIG. 2.

Figure 4:
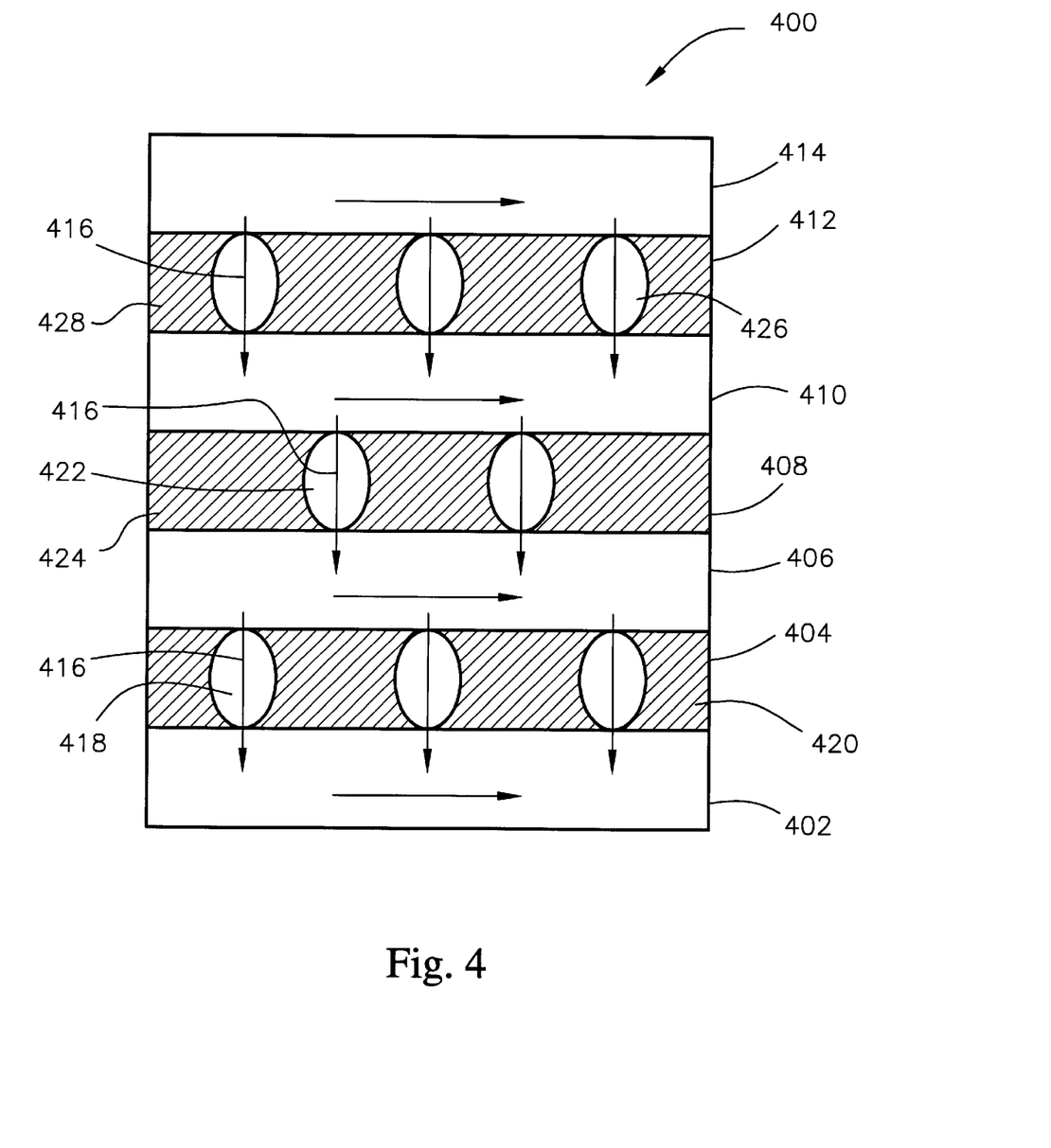
FIG. 4 depicts a cross-sectional schematic diagram of a CPP multilayer magnetoresistive sensor according to another alternative embodiment of the present invention.

In addition, the heterogeneous spacer layers may be used in a CPP multilayer magnetoresistive sensor, which is similar to a GMR multilayer structure disclosed in U.S. Pat. No. 5,576,914, according to another alternative embodiment of the present invention. A CPP multilayer magnetoresistive sensor may include multiple ferromagnetic layers and multiple heterogeneous spacer layers, wherein each heterogeneous spacer layer is disposed between two ferromagnetic free layers. FIG. 4 depicts a cross-sectional schematic of a CPP multilayer magnetoresistive sensor 400, which includes only four ferromagnetic free layers 402, 406, 410, and 414, and three spacer layers 404, 408, and 412 for the sake of simplicity. As shown in FIG. 4, the heterogeneous spacer layer 404, which includes conductive grains 418 within a highly resistive matrix 420, is sandwiched by two ferromagnetic free layers 402 and 406. The heterogeneous spacer layer 408, which includes conductive grains 422 within a highly resistive matrix 424, is disposed between two ferromagnetic free layers 406 and 410. The heterogeneous spacer layer 412, which is composed of conductive grains 426 in a highly resistive matrix 428, is disposed between two ferromagnetic free layers 410 and 414. A sensing electrical current 416 passes through the conductive grains 418, 422, and 426 of the heterogeneous spacer layers 404, 408, and 412 respectively.

The materials of the ferromagnetic free layers and the heterogeneous spacer layers of the CPP multilayer magnetoresistive sensor 400 are similar to those of the corresponding layers in CPP simple spin valve 200 described in FIG. 2.

The resistance of the CPP multilayer magnetoresistive sensor 400 is much higher than the resistance of the CPP spin valve 200 described in FIG. 2 since each additional heterogeneous spacer layer will add a resistance to the total resistance of the CPP multilayer magnetoresistive sensor 400. For example, CPP magnetoresistive sensor 400 has a multilayer structure including three spacer layers that have a total resistance of about 3.6 $\Omega$ (i.e., 1.2 $\Omega$/per each spacer layer×3 layers). Thus, the total resulting resistance of CPP multilayer magnetoresistive sensor 400 can be about 5.6 $\Omega$. The resistance and, hence, the voltage signal of the CPP multilayer magnetoresistive sensor 400 are increased about 180% comparing with a conventional CPP spin valve, which has a total resistance of about 2 $\Omega$. Specific values and numbers are for illustration only without limiting the scope of the invention.

According to a second embodiment of the present invention, CCP magnetoresistive sensors of the type depicted in above embodiments are produced by depositing at least two magnetic a layers and at least one heterogeneous spacer layer between two magnetic layers. There are several methods of making a heterogeneous spacer layer. A well-known way to produce heterogeneous spacer layers is to co-sputter deposit an immiscible conductive material and an insulating or highly resistive material. The production of oxide/metal "cermets" was explored by J. Gittleman in the 60's and 70's (Abeles et al., "Physical Review Letters", No.35, p.247). The heterogeneous spacer layers can be produced from metals such as copper or gold, with oxides, such as $SiO_2$ and $Al_2O_3$. These heterogeneous spacer layers can typically have metallic grains with sizes between about 20 Å and about 80 Å, which are suitable sizes for the application to increase the resistance of a CPP magnetoresistive sensor of the present invention. The heterogeneous spacer layer may be made of gold and silicon that has high resistivity, since the Au—Si phase diagram shows no miscibility at room temperature.

Figure 5A:
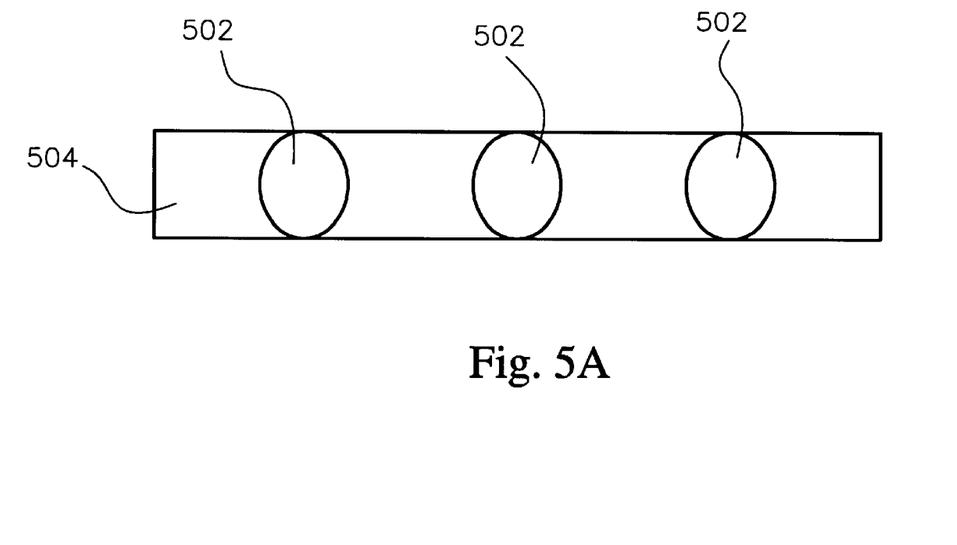
FIGS. 5A–B are cross-sectional schematic diagrams showing steps of a process of making a heterogeneous spacer layer according to a second embodiment of the present invention.
Figure 5B:
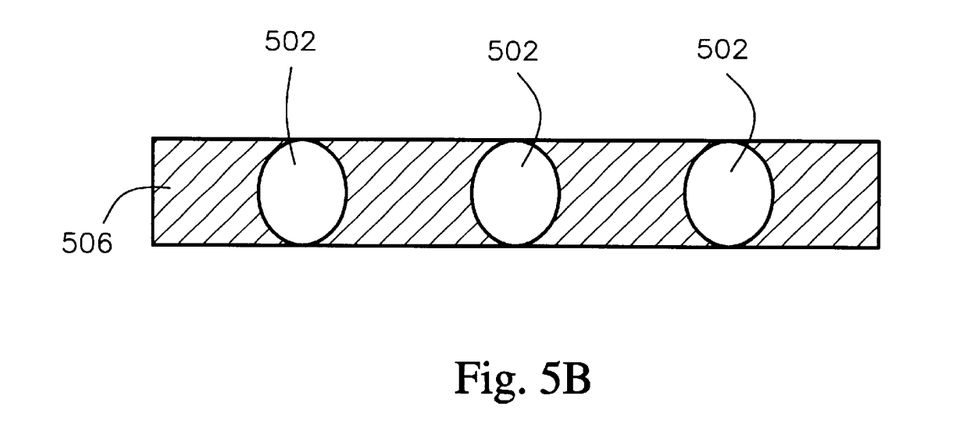

Another method of making heterogeneous spacer layer is illustrated in FIGS. 5A–B. In FIG. 5A, a heterogeneous metal layer consisting of grains of metal 502 and metal 504 is deposited. Metal 504 can be oxidized, and metal 502 resists oxidation relative to metal 504. These two metals 502 and 504 are then exposed to oxygen so that metal 504 is oxidized to become an oxide 506, while the metal 502 remains metallic, as shown in FIG. 5B. For example, a layer of heterogeneous material containing Au and Ni is co-sputtered deposited. As this layer is exposed to oxygen, Ni metal will be oxidized to NiO oxide, while Au remains in metallic form.

Figure 6A:
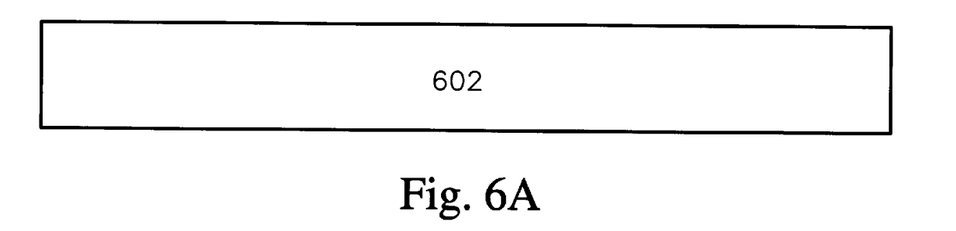
FIGS. 6A–C depict cross-sectional schematic diagrams showing steps of making a heterogeneous spacer layer according to an alternative embodiment of the present invention.
Figure 6B:
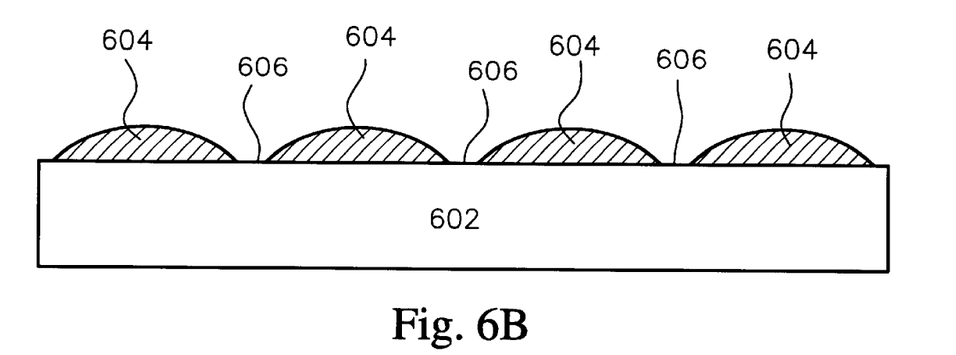
Figure 6C:
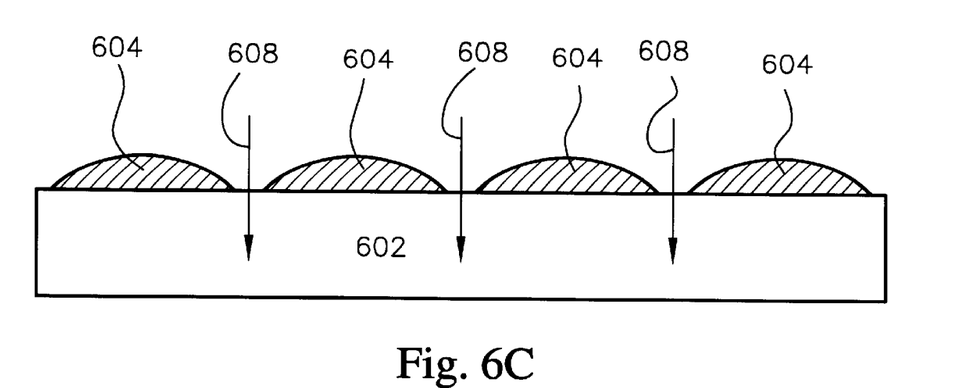

An alternative method of making heterogeneous spacer layers is illustrated in FIGS. 6A–C. As shown in FIG. 6A, a layer 602 of a GMR spacer material, such as Cu, Au or Ag, is first deposited. A discontinuous layer 604 of an insulating or highly resistive material, such as $SiO_2$, is then deposited on top of the conductive layer 602 as shown in FIG. 6B. The holes 606 in the discontinuous layer 604 result in limited current paths for electrons 608, which is shown in FIG. 6C, thus the electron scattering effect is prevented.

Figure 7A:
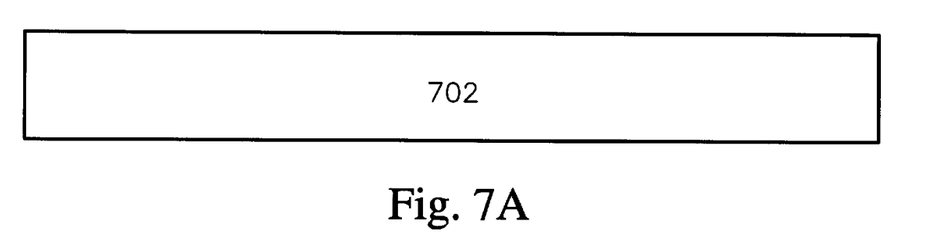
FIGS. 7A–C depict cross-sectional schematic diagrams showing steps of making a heterogeneous spacer layer according to another alternative embodiment of the present invention.
Figure 7B:
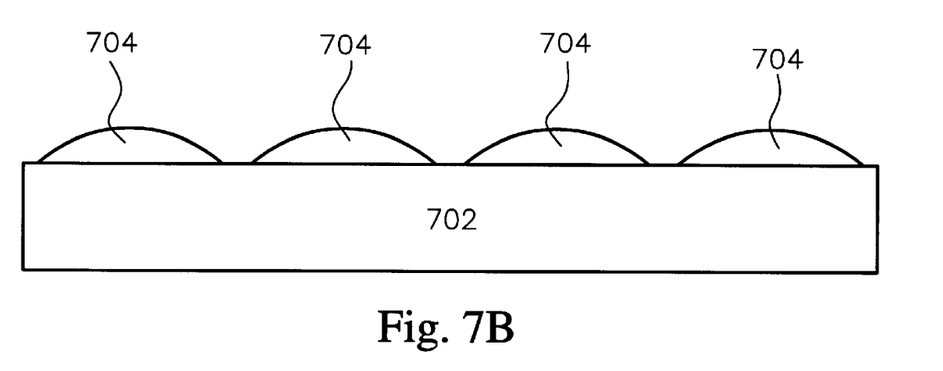
Figure 7C:
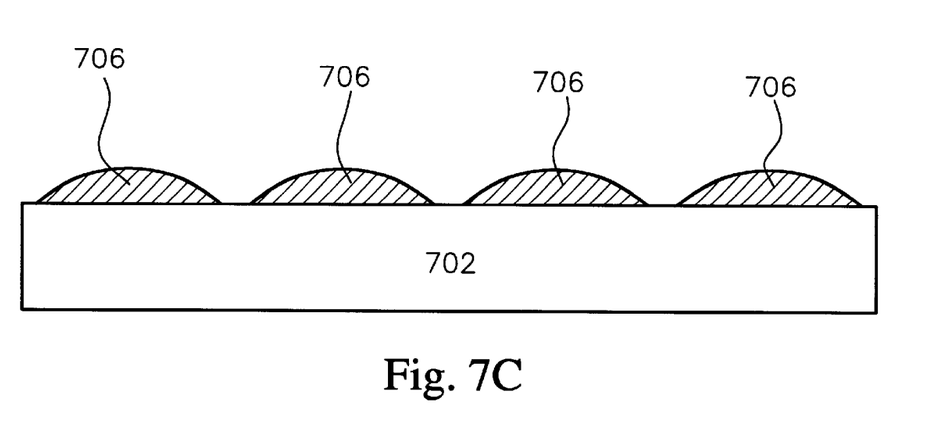

A further alternative method of producing a heterogeneous spacer layer is shown in FIGS. 7A–C. As shown in FIG. 7A, a layer 702 of a GMR spacer material, which resists oxidation, such as Au, is first deposited. A discontinuous layer 704 of another metal is deposited on top of the layer 702 as shown in FIG. 7B. Layers 702 and 704 are then exposed to oxygen so that the layer 704 is oxidized to become an oxide 706, which is shown in FIG. 7C. The holes 708 in the discontinuous layer 706 result in limited current paths for the electrons. However, the heterogeneous spacer layer made by this method is rougher than ones made by the above methods.

Figure 8A:
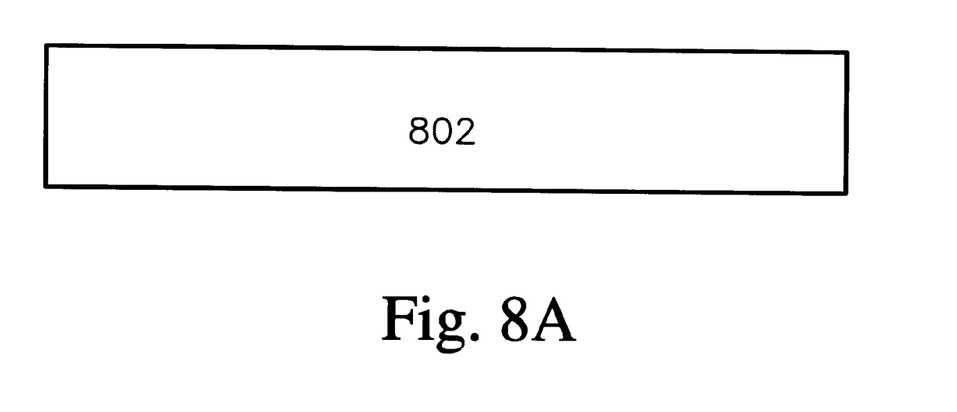
FIGS. 8A–B depict cross-sectional schematic diagrams showing steps of making a heterogeneous spacer layer according to an alternative embodiment of the present invention.
Figure 8B:
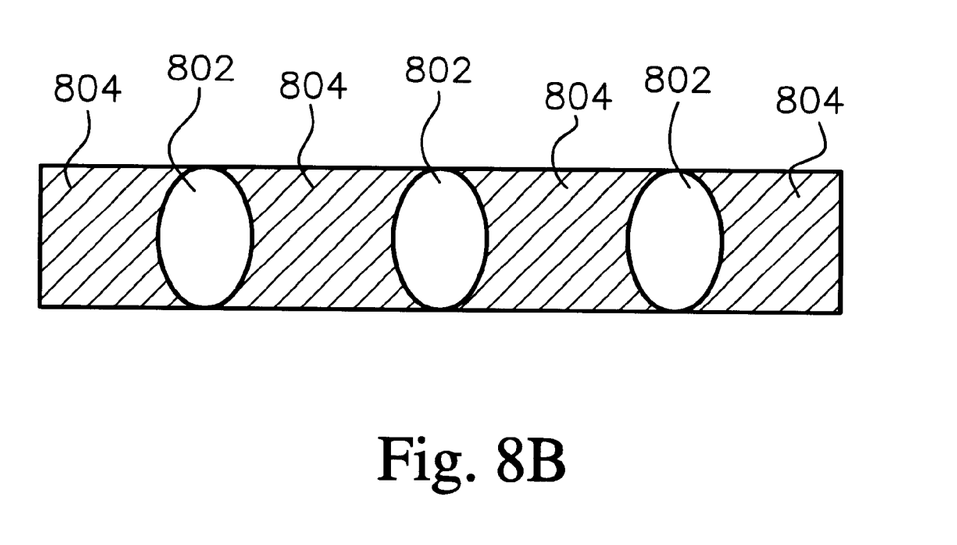

An additional method of making a heterogeneous spacer layer is shown in FIGS. 8A–B. As shown in FIG. 8A, a homogeneous layer 802 of a GMR spacer material, such as Cu, is first deposited. Homogeneous layer 802 is then partially oxidized to produce a heterogeneous layer including conductive grains 802 of Cu within a highly resistive matrix 804 of CuO.

Figure 9:
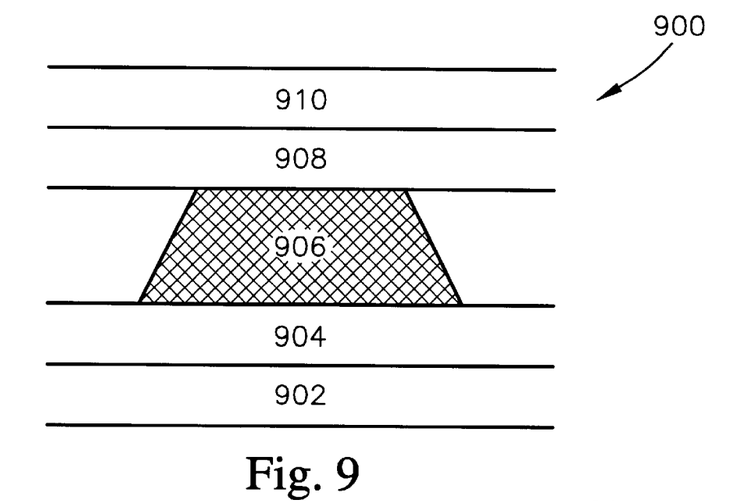
FIG. 9 depicts a cross-sectional schematic diagram of a CPP GMR read/write head according to a third embodiment of the present invention.

CPP magnetoresistive sensors having features in common with CPP magnetoresistive sensors described in FIGS. 2–4 are incorporated in CPP GMR read/write heads as shown in FIG. 9 according to a third embodiment of the present invention. As shown in FIG. 9, a CPP GMR read/write head 900 includes a first shield 902 contacting a first conductive gap 904, a second shield 910 contacting a second conductive gap 908, and a CPP magnetoresistive sensor 906, which includes a heterogeneous spacer layer, disposed between the first and the second conductive gaps 904 and 908. Shields 902 and 904 may act as two leads for conducting a sensing electrical current to the CPP magnetoresistive sensor 906 when reading data stored on a magnetic recording medium.

Figure 10:
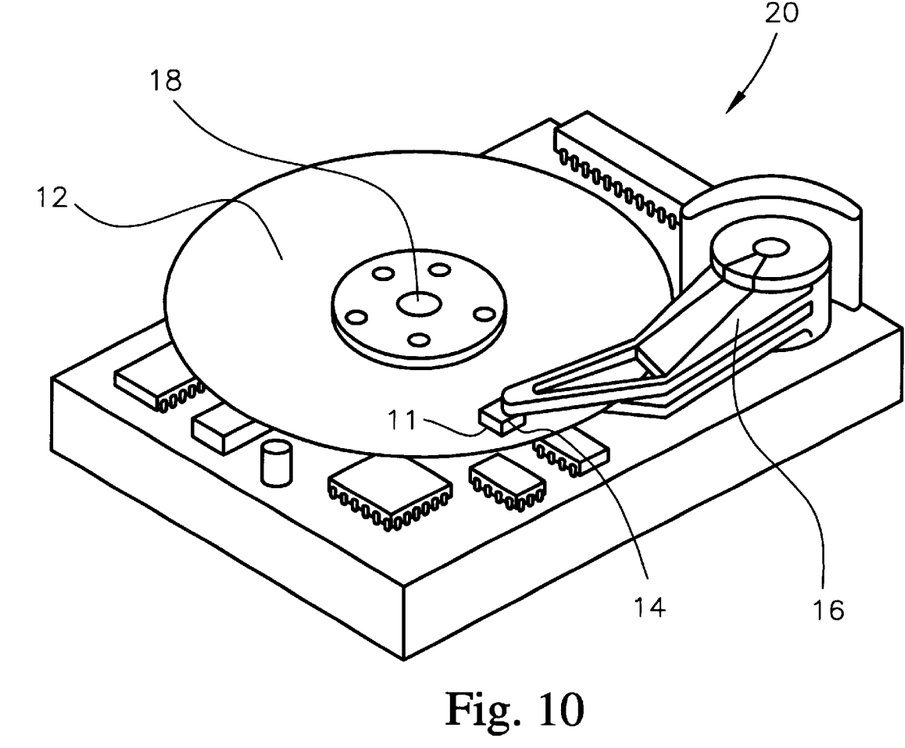
FIG. 10 illustrates a schematic diagram of a disk drive according to a fourth embodiment of the present invention.

CCP GMR read/write heads of the type depicted in FIG. 9 can be incorporated into disk drives, as shown in FIG. 10, according to a fourth embodiment of the present invention. As shown in FIG. 10, a disk drive 20 includes a magnetic recording disk 12 connecting to a mechanism such as a motor 18, a CCP GMR read/write head 14 having a CPP magnetoresistive sensor 11 connecting to an actuator 16. The CPP magnetoresistive sensor 11 includes a heterogeneous spacer layer as described above. The motor 18 moves the magnetic recording disk 12 with respect to the CPP GMR read/write head 14. The actuator 16 moves the CPP GMR read/write head 14 across the magnetic recording disk 12 so the CPP GMR read/write head 14 can access different regions of magnetically recorded data on the magnetic recording disk 12.

It will be clear to one skilled in the art that the above embodiment may be altered in many ways without departing from the scope of the invention. Accordingly, the scope of the invention should be determined by the following claims and their legal equivalents.

What is claimed is:

1. A current-perpendicular-to-plane (CPP) magnetoresistive sensor comprising:
    a) at least two magnetic layers; and
    b) at least one heterogeneous spacer layer disposed between the two magnetic layers, wherein the heterogeneous spacer layer is made of a heterogeneous material which is composed of conductive grains within a highly resistive matrix, and wherein the heterogeneous spacer layer substantially increases resistance of the CPP magnetoresistive sensor without reducing magnetoresistance thereof, the content of the conductive grains in the heterogeneous spacer layer being between about 0.1 volume % and about 50 volume %.

2. The CPP magnetoresistive sensor of claim 1, wherein the highly resistive matrix comprises NiO.

3. The CPP magnetoresistive sensor of claim 1, wherein the materials of the conductive grains and the highly resistive matrix have low miscibility.

4. The CPP magnetoresistive sensor of claim 1, wherein at least one of the magnetic layers has a magnetization pinned by an anti-ferromagnetic layer.

5. A current-perpendicular-to-plane (CPP) giant magnetoresistive (GMR) read/write head comprising:
    a) a first shield;
    b) a first conductive gap adjacent to the first shield;
    c) a second shield;
    d) a second conductive gap adjacent to the second shield; and
    e) a CPP magnetoresitive sensor disposed between the first and second conductive gaps;
    wherein the CPP magnetoresistive sensor comprises:
        i) at least two magnetic layers; and
        ii) at least one heterogeneous spacer layer disposed between the two magnetic layers, wherein the heterogeneous spacer layer is made of a heterogeneous material which is composed of conductive grains within a highly resistive matrix, the content of the conductive grains in the heterogeneous spacer layer being between about 0.1 volume % and about 50 volume %.

6. The CPP GMR read/write head of claim 5, wherein the materials of the conductive grains and the highly resistive matrix are immiscible or have a very low miscibility.

7. A disk drive comprising:
   a) a magnetic recording disk;
   b) a current-perpendicular-to-plane (CPP) giant magnetoresistive (GMR) read/write head including a CPP magnetoresistive sensor;
   c) an actuator connected to the CPP GMR read/write head for moving the CPP GMR recording head across the magnetic recording disk;
   d) a mechanism connected to the magnetic recording disk for moving the magnetic recording disk relative to the CPP GMR read/write head;
   wherein the CPP magnetoresistive sensor comprises:
     i) at least two magnetic layers; and
     ii) at least one heterogeneous spacer layer disposed between the two magnetic layers, wherein the heterogeneous spacer layer is made of a heterogeneous material which is composed of conductive grains within a highly resistive matrix, the content of the conductive grains in the heterogeneous spacer layer being between about 0.1 volume % and about 50 volume %.

8. The disk drive of claim 7, wherein the materials of the conductive grains and the highly resistive matrix are immiscible or have a very low miscibility.

9. The CPP magnetoresistive sensor of claim 1, wherein the material of the conductive grains comprises Cu and the content of the conductive grains in the heterogeneous spacer layer is about 5 volume %.

10. The CPP magnetoresistive sensor of claim 1, wherein the material of the highly resistive matrix is an oxidized form of the material of the conductive grains.

11. The CPP magnetoresistive sensor of claim 1, wherein the conductive grains comprise metallic grains with sizes between about 20 Å and about 80 Å.

12. A current-perpendicular-to-plane (CPP) magnetoresistive sensor comprising:
    a) at least two magnetic layers; and
    b) at least one heterogeneous spacer layer disposed between the two magnetic layers, wherein the heterogeneous spacer layer comprises:
       a layer of conductive material; and
       a discontinuous layer of highly resistive material adjacent to the layer of conductive material, wherein holes in the discontinuous layer result in limited current paths for electrons.

13. The CPP magnetoresistive sensor, according to claim 12, wherein the conductive material comprises a material selected from the group of Cu, Au, and Ag.

14. The CPP magnetoresistive sensor, according to claim 12, wherein the highly resistive material comprises an oxide of a metal.

15. The CPP magnetoresistive sensor, according to claim 12, wherein the highly resistive material comprises $SiO_2$.

* * * * *